United States Patent
Gregg et al.

(10) Patent No.: US 6,921,062 B2
(45) Date of Patent: Jul. 26, 2005

(54) VAPORIZER DELIVERY AMPOULE

(75) Inventors: John Gregg, San Jose, CA (US); Scott Battle, Cedar Park, TX (US); Jeffrey I. Banton, Burnet, TX (US); Donn Naito, Marble Falls, TX (US); Marianne Fuierer, Durham, NC (US)

(73) Assignee: Advanced Technology Materials, Inc., Danbury, CT (US)

( * ) Notice: Subject to any disclaimer, the term of this patent is extended or adjusted under 35 U.S.C. 154(b) by 138 days.

(21) Appl. No.: 10/201,518

(22) Filed: Jul. 23, 2002

(65) Prior Publication Data

US 2004/0016404 A1 Jan. 29, 2004

(51) Int. Cl.[7] .............................. B01F 3/04; C23G 16/00
(52) U.S. Cl. ....................... 261/23.1; 261/142; 261/147; 261/DIG. 65; 34/211; 34/380; 34/497; 34/510; 118/726
(58) Field of Search ..................... 261/23.1, 74, 121.1, 261/124, 142, 147, DIG. 65, DIG. 89; 118/726; 34/209, 211, 359, 380, 493, 497, 510

(56) References Cited

U.S. PATENT DOCUMENTS

| 2,721,064 | A | * | 10/1955 | Reichardt ..................... 261/21 |
|---|---|---|---|---|
| 2,769,624 | A | * | 11/1956 | Burnside ................... 261/23.1 |
| 3,834,682 | A | * | 9/1974 | McPhee ....................... 261/123 |
| 4,190,965 | A | * | 3/1980 | Erickson ....................... 34/196 |
| 4,916,828 | A | * | 4/1990 | Yamane et al. ................ 34/364 |
| 5,078,976 | A | * | 1/1992 | Shibauchi et al. ........... 422/298 |
| 5,476,547 | A | * | 12/1995 | Mikosh et al. ............... 118/726 |
| 5,904,771 | A | | 5/1999 | Tasaki et al. |
| 6,107,634 | A | | 8/2000 | Horsky |
| 6,270,839 | B1 | * | 8/2001 | Onoe et al. ............... 427/248.1 |
| 6,288,403 | B1 | | 9/2001 | Horsky et al. |
| 6,581,915 | B2 | * | 6/2003 | Bartsch et al. ................. 261/26 |
| 6,607,785 | B2 | | 8/2003 | Timmons et al. |
| 2003/0121608 | A1 | | 7/2003 | Chen et al. |

FOREIGN PATENT DOCUMENTS

| JP | 58-126973 | * | 7/1983 |
|---|---|---|---|
| JP | 60-70176 | * | 4/1985 |
| JP | 4333572 | | 11/1992 |

* cited by examiner

Primary Examiner—Scott Bushey
(74) Attorney, Agent, or Firm—Marianne Fuierer; Margaret Chappuis; Tristan A. Fuierer

(57) ABSTRACT

A vaporizer delivery system for use in semiconductor manufacturing processes including a plurality of vertically stacked containers for holding a vaporizable source material. Each of the vertically stacked containers includes a plurality of vented protuberances extending into the interior of the each stacked container thereby providing channels for passage of a carrier gas between adjacent vertically stacked containers.

33 Claims, 10 Drawing Sheets

VAPORIZER DELIVERY AMPOULE

BACKGROUND OF INVENTION

1. Field of the Invention

The present invention relates to a vaporizer, and more particularly, to a vaporizer delivery system having multiple containers to provide increased surface area for vaporization of liquids and solid materials, e.g., liquid and solid source reagents used in chemical vapor deposition (CVD), atomic layer chemical vapor deposition (ALCVD) and ion implantation processes.

2. Description of the Related Art

Chemical vapor deposition (CVD) has been extensively used for preparation of films and coatings in semiconductor wafer processing. CVD is a favored deposition process in many respects, for example, because of its ability to provide highly conformal and high quality films, at relatively fast processing times. Further, CVD is beneficial in coating substrates of irregular shapes including the provision of highly conformal films even with respect to deep contacts and other openings.

In general, CVD techniques involve the delivery of gaseous reactants to the surface of a substrate where chemical reactions take place under temperature and pressure conditions that are favorable to the thermodynamics of the desired reaction. The type and composition of the layers that can be formed using CVD is limited by the ability to deliver the reactants or reactant precursors to the surface of the substrate. Various liquid reactants and precursors, are successfully used in CVD applications by delivering the liquid reactants in a carrier gas. In liquid reactant CVD systems, the carrier gas is typically bubbled at a controlled rate through a container of the liquid reactant so as to saturate the carrier gas with liquid reactant and the saturated carrier is then transported to the reaction chamber.

Analogous attempts have been made to deliver solid reactants to a CVD reaction chamber, but with much less success. The delivery of solid precursors in CVD processing is carried out using the sublimator/bubbler method in which the precursor is usually placed in a sublimator/bubbler reservoir which is then heated to the sublimation temperature of the precursor to transform it into a gaseous compound which is transported into the CVD reactor with a carrier gas such as hydrogen, helium, argon, or nitrogen. However, this procedure has been unsuccessful in reliably and reproducibly delivering solid precursor to the reaction chamber for a number of reasons. The major problems with the technique are centered on the inability to consistently vaporize a solid at a controlled rate such that a reproducible flow of vaporized solid precursor can be delivered to the process chamber. Also, it is difficult to ensure complete saturation of the fast flowing carrier gas stream because of a limited amount of exposed surface area of the solid precursor in the vaporizer system and lack of uniform temperature to provide maximum sublimation.

Similar problems are inherent in conventional ion implantation systems that include an ion source in which a dopant element is ionized and then subsequently accelerated to form an ion beam directed at a workpiece surface for implantation. When a solid dopant material is used, it is generally placed within a vaporizer to be heated and the subsequently formed vapors are transported into the interior of the ion source for ionization and subsequent ion beam formation.

Solid ion source material is greatly preferred for safety reasons, however, solid semiconductor dopants have presented serious technical and operating problems. For instance, utilization of a solid precursor material in vaporizers causes extended down time of the instrumentation, poor product quality, and deposit buildup within the vaporizer.

Prior art vaporizer systems have numerous disadvantages, including buildup of condensed material within the vaporizers, and formation of "cold spots" within the interior of the vaporizers due to lack of uniform heating therein. The buildup of unwanted deposits is exacerbated in vaporizer systems that require internal moving surfaces for revolving individual vials and/or wells of source material. These internal mechanisms introduce additional "cold spots" within the vaporizers and provide for further deposition of vaporized material. Additionally, due to the buildup of deposits on internal moving mechanisms, operation of these vaporizers is not efficient or reliable. The shortcomings of the prior art vaporizers are especially noticeable with solid source materials that are temperature-sensitive with a low vapor pressure. Thus, it is difficult to vaporize a solid at a controlled rate such that a reproducible flow of vaporized solid precursor can be delivered to a downstream deposition system.

Accordingly, there is need in the art for a vaporizer system that efficiently vaporizes solid and/or liquid chemical sources without concomitant disadvantages of the prior art, such as thermal disassociation of the source material, inoperability of internal moving parts due to deposit buildup within the vaporizer, condensation of low vapor pressure compounds due to "cold spots" within the vaporizer, and/or inconsistent vapor flow to downstream deposition systems.

SUMMARY OF THE INVENTION

The present invention relates to a vaporizer system and method for vaporizing solid and liquid chemical sources having particular utility for semiconductor manufacturing applications.

In one aspect, the present invention relates to a vapor delivery system for vaporization and delivery of a source material that provides sufficient surface area with uniform carrier gas flow to meet the flow rates required for typical deposition applications, comprising:

a) at least one container for holding a vaporizable source material;

b) a plurality of vented protuberances positioned in the container, wherein the vented protuberances provide channels for passage of the vaporizable source material; and c) a carrier gas tube to introduce a stream of the carrier gas for passage through the container.

In another aspect, the present invention provides for a vapor delivery system for vaporization and delivery of a precursor, comprising:

a) an ampoule comprising an ampoule bottom, sidewall and removable top to form an internal ampoule compartment;

b) a gas inlet and gas outlet communicatively connected to the ampoule;

c) at least one container positioned within the internal ampoule compartment, wherein the container comprises a container bottom and side wall to form a container cavity; and d) a plurality of vented protuberances positioned in at least the container bottom to provide a channel therethrough, and wherein the vented protuberances extend into the container cavity.

As described more fully hereinafter, the precursor may comprise a solid or liquid source material. Preferably, the precursor is a solid precursor including, but are not limited to, decaborane, boron, phosphorous, gallium, indium, copper, antimony, hafnium tetrachloride, zirconium tetrachloride, arsenic, indium trichloride, metalorganic β-diketonate complexes, cyclopentadienylcycloheptatrienyl-titanium ($C_p$TiCht), aluminum trichloride, titanium iodide, cyclooctatetraenecyclopentadienyltitanium, biscyclopentadienyltitaniumdiazide, and tungsten carbonyl.

In yet another aspect, the present invention relates to a vaporizer unit that can easily be inserted into a conventional ampoule with minimum retrofitting of the processing tools, comprising:

a) a plurality of vertically stacked containers wherein each container has a cavity for holding a source material;

b) a plurality of vented protuberances positioned in each of the vertically stacked containers and extending into each respective cavity, wherein the vented protuberances form channels for passage of a carrier gas between adjacent vertically stacked containers; and c) a carrier gas tube contacting the plurality of vertically stacked containers and extending through the cavity of each vertically stacked container.

In still a further aspect, the present invention provides for a vaporizer comprising:

a) an ampoule having an ampoule bottom and an ampoule sidewall to form an internal compartment;

b) an ampoule top to enclose the internal compartment;

c) a gas inlet and outlet communicatively connected to the ampoule top;

d) a plurality of vertically stacked contacting containers positioned within the internal compartment, wherein each container comprises a container bottom and a container sidewall to form a container cavity for holding of a solid precursor material, and wherein each container sidewall contacts the ampoule sidewall;

e) a plurality of vented protuberances positioned on each container bottom to provide channels between adjacent vertically stacked contacting containers, wherein the vented protuberances extend into the container cavity;

f) a carrier gas dip tube positioned within the internal compartment and communicatively connected to the gas inlet for directing a carrier gas to below the vertically stacked contacting containers; and g) means for heating the ampoule.

In another aspect, the present invention relates to a container comprising a plurality of tapered protuberances having conical shaped pores which narrow as the tapered protuberances extend into the container cavity. This configuration for the protuberances provides for essentially one-way flow of the carrier gas through the plurality of vertically stacked containers positioned within the ampoule.

In yet another aspect, the present invention provides a method for vaporizing and delivering a source material to a downstream process chamber, comprising:

a) providing a plurality of interconnected, vertically stacked containers having a vaporizable source material contained therein, wherein each of interconnected, vertically stacked containers comprise a plurality of channeled protuberances;

b) positioning the interconnected, vertically stacked containers within a sealable ampoule;

c) applying heat to the sealable ampoule in a sufficient amount to vaporize the source material therein; and d) introducing a carrier gas into the sealable ampoule for moving the vaporized source material through the sealable ampoule to the process chamber.

Other aspects and features of the invention will be more fully apparent from the ensuing disclosure and appended claims.

DETAILED DESCRIPTION OF THE INVENTION AND PREFERRED EMBODIMENTS THEREOF

The present invention is based on the observation that certain source materials used in vaporizer systems are not adequately vaporized in sufficient quantities to meet the flow rates required for typical deposition applications. In some cases, to achieve needed flowrate, high temperatures in excess of 200° C. have been used to increase the sublimation rate which can cause decomposition of the source material.

Figure 1:
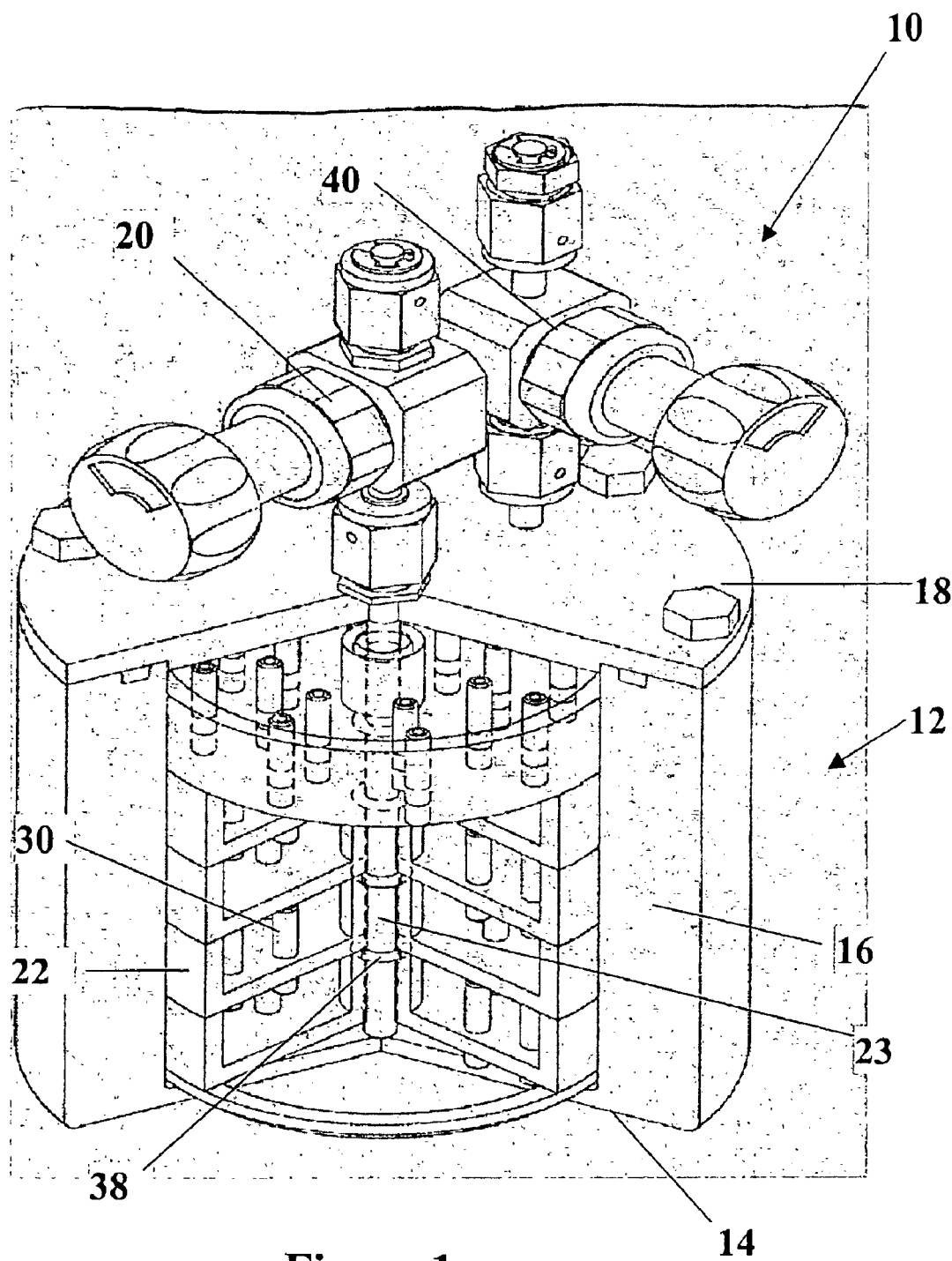
FIG. 1 is perspective view of a vaporizer in accordance with one embodiment of the present invention.

A vaporizer in accordance with one embodiment of the present invention and illustrated in FIG. 1 overcomes the deficiencies of prior art vaporizers. The vaporizer delivery system 10 comprises an ampoule 12, fabricated of a suitable heat-conducting material, such as for example silver, silver alloys, copper, copper alloys, aluminum, aluminum alloys, lead, nickel clad, stainless steel, graphite and/or ceramic material. The ampoule comprises a bottom 14 and sidewall 16 to form an internal compartment,The ampoule can be any shape that facilitates an even flow of carrier gas through the ampoule, such as the shown cylindrical shape. The preferred shape of the ampoule base is cylindrical shape machined to very tight tolerances to allow only $1/1000^{th}$ to $3/1000^{th}$ of an inch clearance with the precisely machined containers. The container installation requires that the walls be extremely parallel to ensure that each the side wall of the container has good thermal contact with the interior walls of the ampoule base. Understanding, the close tolerance that is required to ensure consistent contact of the container with the ampoule interior wall, the installation and removal process of the container unit may require heating and/or cooling of the base and container, respectively, to allow for easy installation.

Carrier gas inlet 20 is preferably positioned on the ampoule top 18 and communicatively connected to the ampoule for introducing the carrier gas into the ampoule.

Positioned within the internal compartment of the ampoule is a plurality of vertically stacked containers 22. The stacked containers are separable from each other and removable from the ampoule for easy cleaning and refilling. Positioned within the ampoule is an internal carrier gas member 23 that is connected (welded) to the gas inlet 20 and directs the carrier gas to the bottom of the internal compartment and below the lowest container in the vertically stacked containers. In FIG. 1, the internal carrier gas member 23 passes through each container cavity 27 (shown in FIG. 3) and container bottom 24. However, it should be understood that to ensure a leak proof seal at the point where the internal carrier gas member intersects the container bottom, a sealing O-ring 38 (shown in FIG. 5) may be positioned between containers especially if the source material is a liquid. An addition of an outer o-ring is also contemplated to seal between containers on the top surface of each container (tray) sidewall.

Also, depending on the solid precursor, there may be a need to stop the entrainment of solid in the carrier gas flow. High purity stainless frits (pore size 1 to 100 microns likely) could be added at any location in the carrier gas flow rate. The frits could be installed at the 'inlet' of each protuberance, a large disk frit could be added to the top tray and sealed therein by pressure from the installation of the lid on the ampoule or on the outlet gas flow path.

Figure 3:
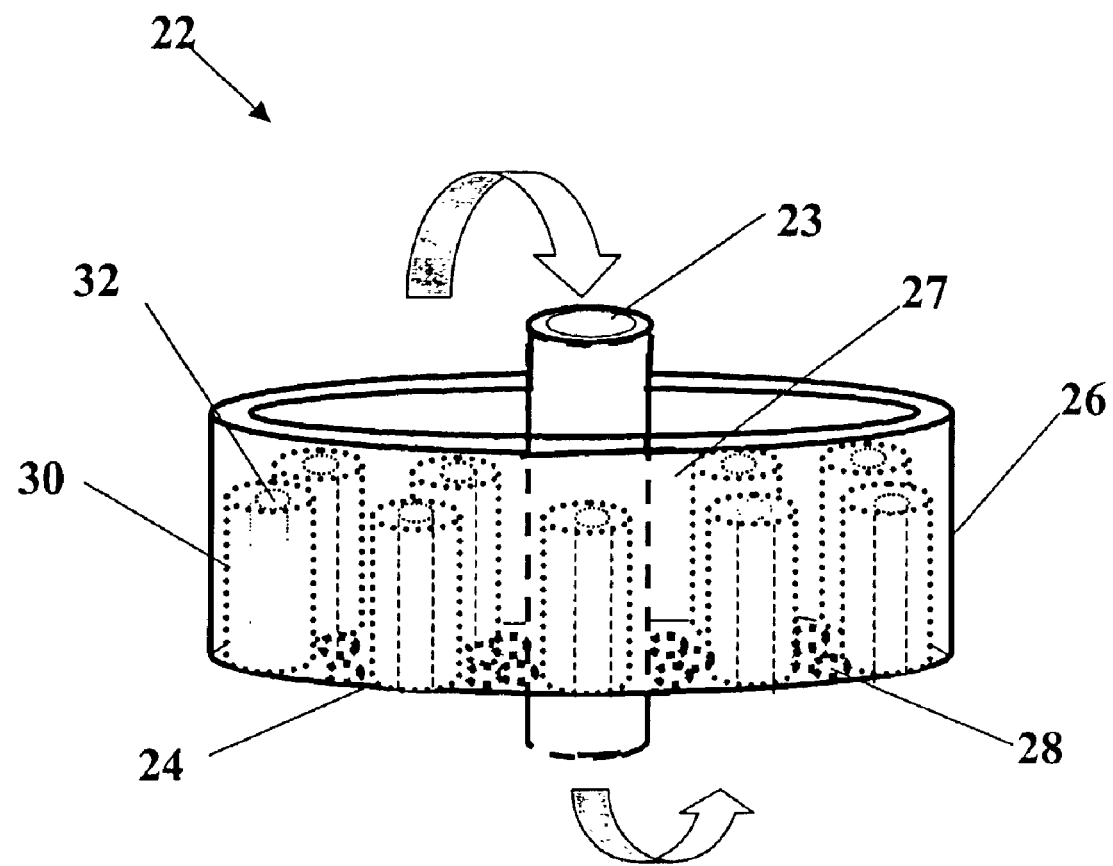
FIG. 3 is a side elevational view of a container illustrating a plurality of cylindrically shaped protuberances of the present invention.

As shown in FIG. 3, each of the individual containers 22 has a bottom 24 and sidewall 26 to form a container cavity 27 for placement of the preferred source material 28. The containers, are preferably fabricated of a non-reactive heat-conducting material, such as for example silver, silver alloys, copper, copper alloys, aluminum, aluminum alloys, lead, nickel clad, stainless steel, graphite and/or ceramic material.

Each of the individual containers further comprises a plurality of protuberances 30 wherein each protuberance includes a passageway 32 for movement of a carrier gas through the protuberance. The shape of the protuberances may be any configuration that provides for an easy flow of gas therethrough. Preferably, the protuberances are cylindrical or conical in shape, such as shown in FIGS. 3 and 4.

Figure 4:
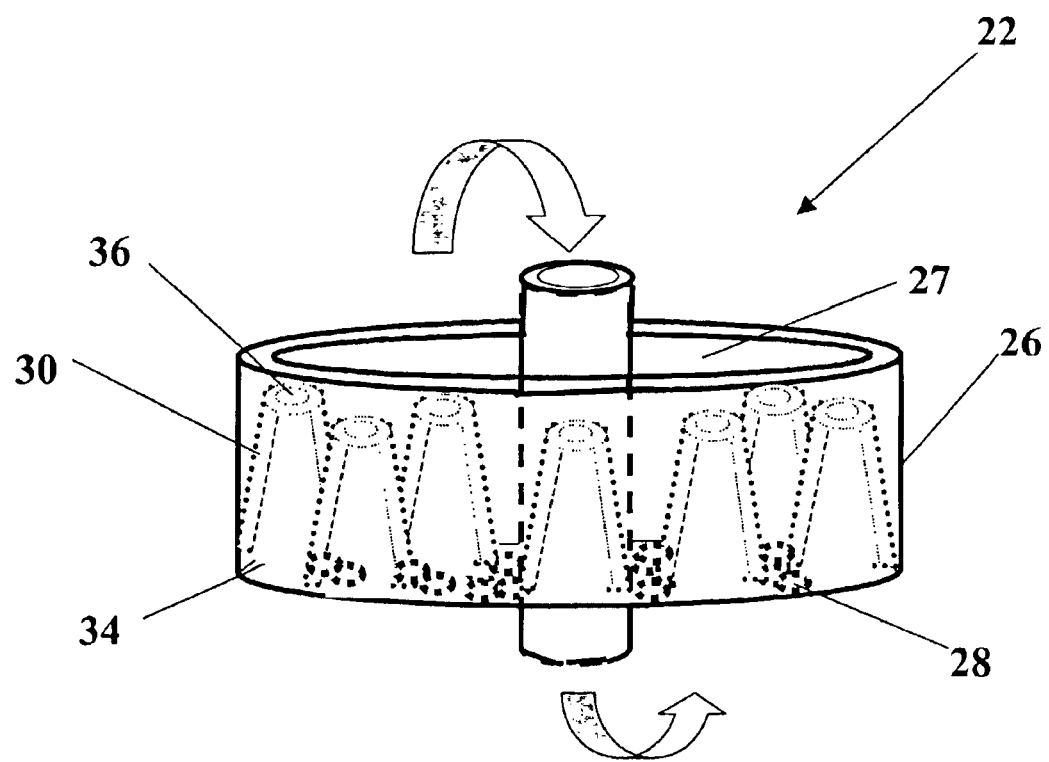
FIG. 4 is a side elevational view of a container illustrating a plurality of conically shaped protuberances of the present invention.

FIG. 4 shows protuberances 30 having a generally funnel-like configuration with a conical shaped pore which narrows as the tapered protuberances extend into the container cavity 27. This conical shaped pore provides for passage of the carrier gas from the adjacent lower container through the larger pore opening 34 into the container cavity (smaller pore 36) while reducing backflow of the carrier gas into the lower adjacent container. Importantly, maintaining a one way flow through the stack of containers increases the removal of the carrier gas that is saturated with the vaporized source material at a flow rate required by many semiconductor processing systems. As the carrier gas, containing vaporized source material, is moved upward from the bottom of the ampoule through the tapered protuberances a whirlpool effect is caused as the gas molecules are forced against the wall of the protuberances. This whirlpool effect moves the carrier gas quickly through the protuberances causing the vaporized source material to make contact with the heated walls of the tapered protuberance. Thus, the vaporized source material maintains contact with the heated container with a concomitant reduction of cold spots that could cause precipitation of the vaporized material and/or clog the channels in the protuberances.

Figure 9:
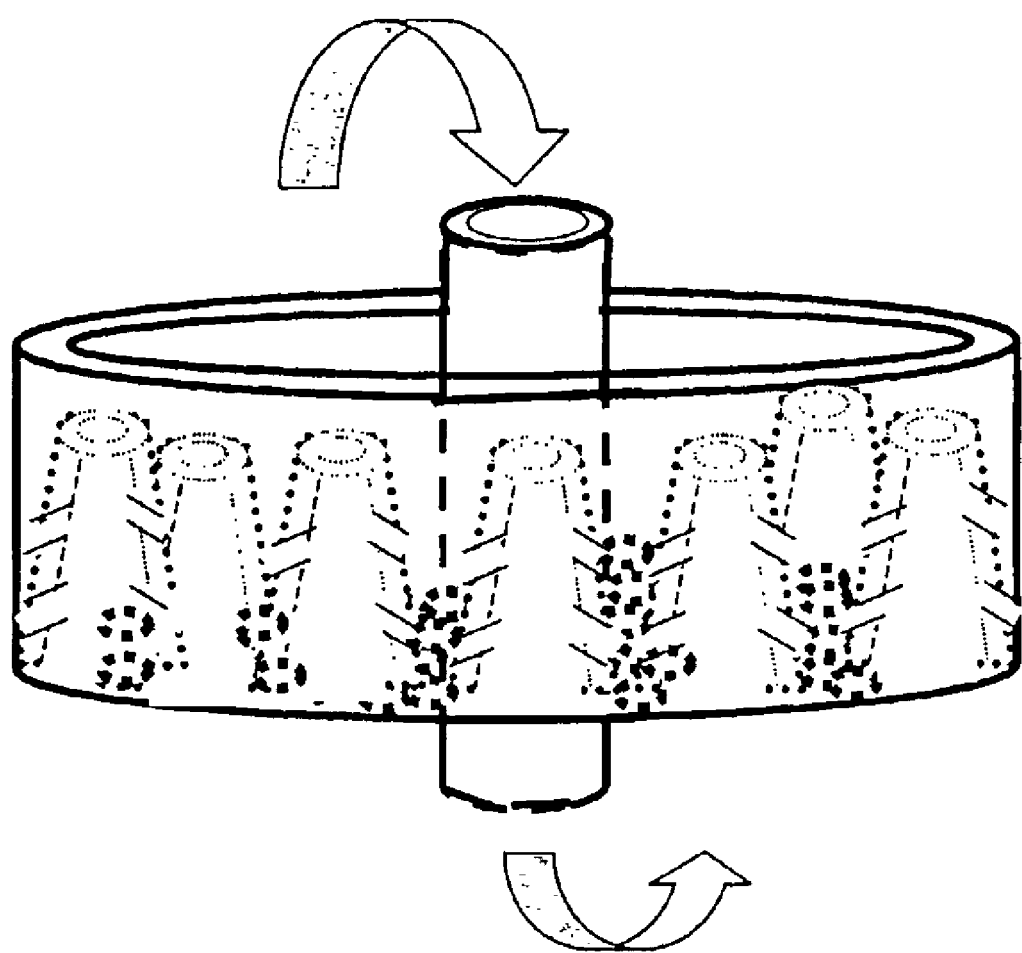
FIG. 9 is a side elevational view of a container illustrating a plurality of conically shaped protuberances including side vents.
Figure 10:
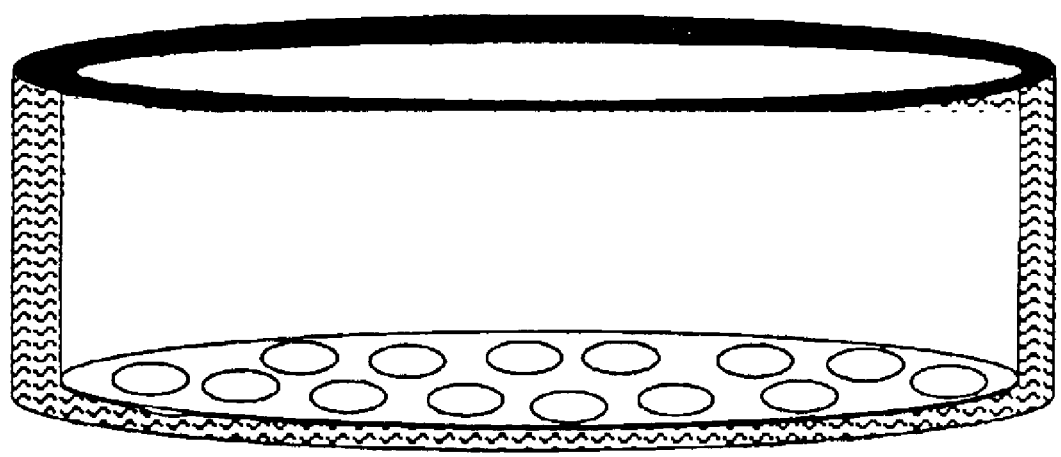
FIG. 10 shows an alternative embodiment of the present invention.

The protuberances can be extensions attached to the container surface, such as commercially available vented stainless steel screws that allow for adjustability to optimize a process or sublimation rate. In the alternative, the protuberances are integrally formed as part of the container bottom and allow for a maximum heat transfer to those protuberances. Preferably, the height of each of the protuberances is approximately the same height as that of the container sidewall or less. More preferably, the height of each protuberance is less than the height of the container sidewall thereby providing a head space above the end of the protuberance for gas dispersion and circulation within the respective container. Alternatively, the containers and protuberances could be configured to create fluidized beds in each of the containers. The carrier gas flow can enter the container below the surface of the solid, understanding that the pore size is sufficient to retain the solid precursor in each container as shown in FIG. 10. Another embodiment relates to protuberances having sidewalls comprising vents therein for transmission of carrier gas through the solid precursor for fluidizing of same such as shown in FIG. 9.

The protuberances should be of a height to provide a leak proof region for placement of a sufficient quantity of source material, whether liquid or solid, to provide the required vaporized material without causing leakage into the underlying container through the open pores 32 of the protuberances. Preferably, each protuberance extends vertically from the bottom of the container from about 0 mm to about 5 mm, and more preferably from about 1.5 mm to about 3.0 mm.

As shown in FIG. 1, the positioning of the protuberances in each container are slightly offset from those in an adjacent container thereby forcing the carrier gas to circulate within the container for contact with the vaporized source material before being transported through the protuberances into the next level container. Advantageously, the multiple levels of contact of the carrier gas provides for saturation of the carrier gas at an increased rate due to the increased amount of source material in the vaporizer system.

The size of the vaporizer delivery system 10 is different depending on the amount of the vaporized gas to be supplied to the downstream CVD apparatus or ion implantation system. The vaporizer generally has a size corresponding to a cylinder having an inner diameter of about 3 to 6 inches, preferably about 3.75 inches. The quantity of containers comprising a stack of containers will be determined by the size of the vaporizer and preferably from three to five containers are enclosed in the ampoule.

The ampoule of the present invention comprising the plurality of internal containers can be heated and kept at a desired temperature in accordance with the type and the supplied amount of the source material, the concentration of the vaporized gas and other operating conditions. The heating can be conducted using a ribbon heater wound around the vaporizer, a block heater having a shape covering the vaporizer or by circulation of hot air or a liquid heat medium. The method of heating is not particularly limited as long as the vaporizer is heated and kept at the desired temperature accurately. It is desirable to heat the ampoule from the sidewalls versus the bottom to reduce the chance of a lower container subliming at a higher temperature and forming a cooler upper container that could be the site for possible condensation which could result in clogging. The preferred heat transfer is from the sidewalls of the ampoule to the sidewalls of the containers. The preheating of the carrier gas may also be a requirement depending on the heating method, length of heated carrier gas inlet tubing and the carrier gas flow rate.

Advantageously, the vaporizer delivery system of the present invention provides a series of heated containers that further provides for a plurality of heated protuberances that increase the heated surface area thereby allowing sublimation of the solid source material because of increased distribution of heat. It may be desirable for the ampoule to have a large thermal mass to provide maintain a more consistent temperature during processing. The present invention has been designed with a large thermal mass based on the fact that it takes heat to sustain sublimation of a solid source material from the solid state to the vapor state. At a given temperature, the vapor pressure of a solid is the partial pressure of that material at the interface, that is, there are as many molecules condensing on the solid surface as the number of molecules sublimating from the surface at a given time period. Equilibrium is destroyed if the molecules in the gaseous state are removed from the solid/gas interface by the carrier gas. Clearly, sublimation takes place at a higher rate to restore equilibrium if there is enough heat supplied to the surface of the solid to make up for the latent heat of sublimation. By providing a plurality of heated protuberances the entire conductive container acts as a heated surface thereby increasing the rate of sublimation, providing an increase flow rate of saturated carrier gas and reducing precipitation of vaporized source material that can clog the channeled protuberances.

The temperature of the vaporizer is different depending on the operating conditions of the downstream CVD apparatus or ion implantation system and the vapor pressure and the amount of the source material. The temperature is generally from about 40 to about 300° C.

The vaporizer delivery system of the present invention may further comprise: lines for supplying a carrier gas and for transferring a vaporized gas that are connected to the vaporizer; and adjusting valves and instruments for measurements of pressure and temperature. Heaters may be provided to maintain the temperature in the gas supply lines and lines that transfer the vaporized material to a downstream semiconductor manufacturing process chamber. It is desirable to have the downstream lines 5 –10° C. hotter than the ampoule to prevent condensation in the lines.

The method of utilizing the vaporizer system of the present invention includes introducing a source material into the containers before stacking within the ampoule. The source material may be solid, liquid or solid dissolved in solvent. Further, the source material may be coated on the surfaces of the container and protuberances within the container cavity in the form of film by any of various methods, including the method of melting the metal complex by heating, applying the molten metal complex to the supports and then cooling. Also, the metal complex can be dissolved in a solvent and applied to the surfaces of the container and protuberances followed by removal of the solvent under reduced pressure. If different source materials are to be utilized in the downstream processing system, the present invention provides the ability to introduce different source material into different containers in the vertically stacked containers.

Figure 2:
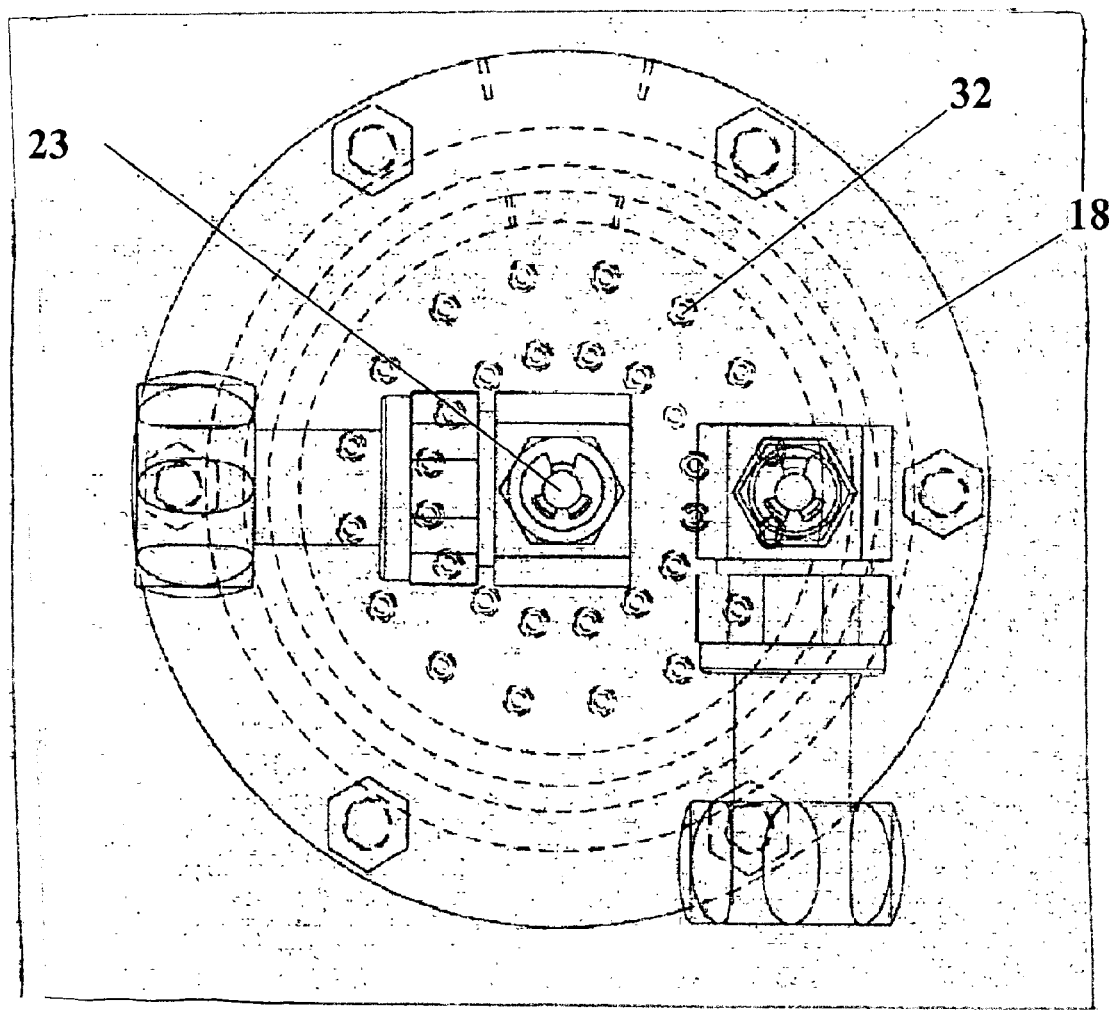
FIG. 2 is a top view of a plurality of vented protrusions positioned in a container positioned in an ampoule in accordance with the present invention.
Figure 5:
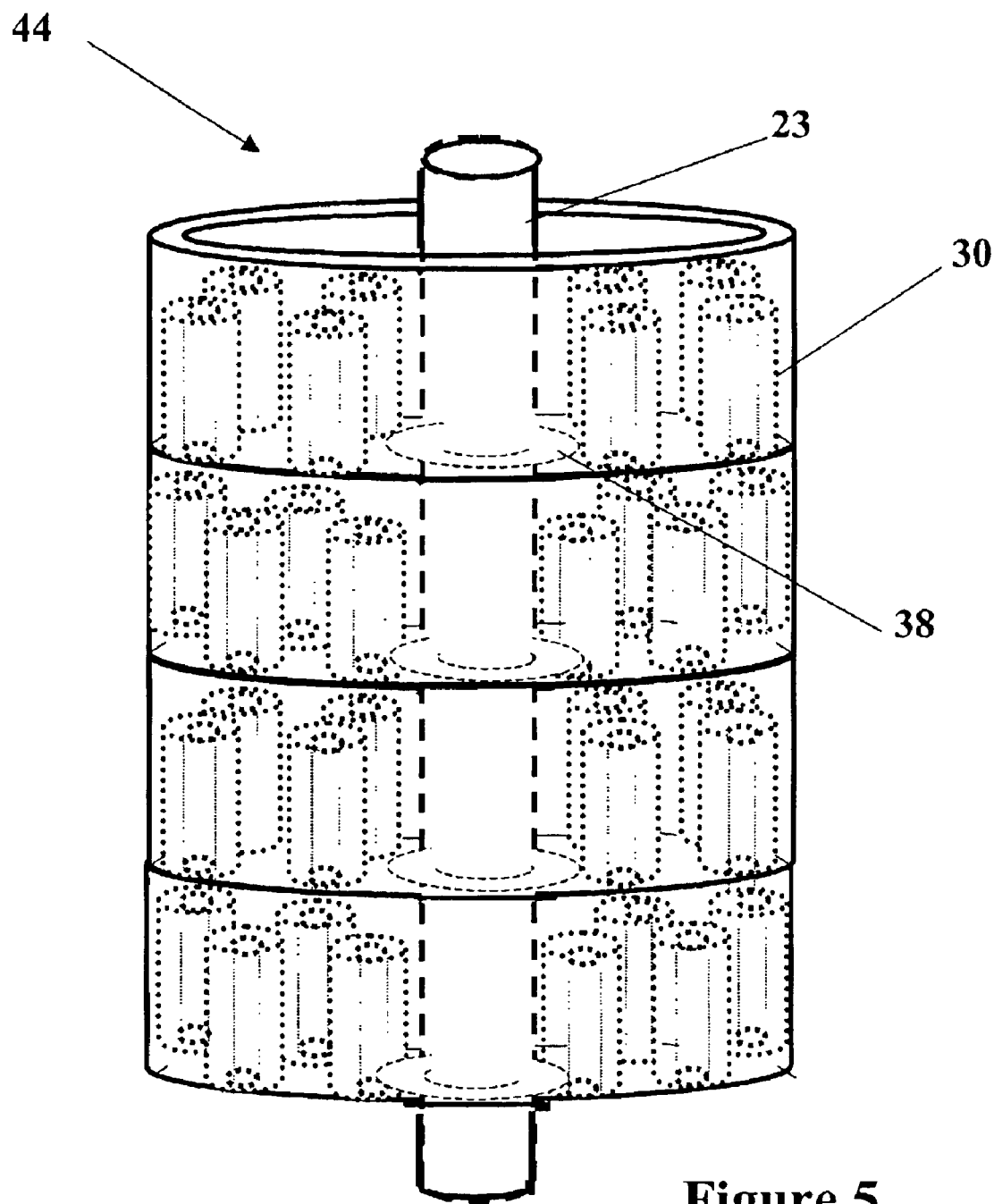
FIG. 5 is side elevational view of a plurality of vertically stacked containers of the present invention.

The vaporizer unit 44, as shown in FIG. 5, which comprises a plurality of vertically stacked containers contacting the internal gas carrier member 23 is placed in the ampoule. The ampoule top lid 18 (shown in FIGS. 1 and 2) is positioned on the top of the conductive ampoule and sealed thereto, such as by an o-ring element (o-ring may be fabricated of teflon, an elastomer or a metal seal) and/or mechanical fasteners, such as screws. Means for heating the ampoule is engaged and the internal temperature within the ampoule and contacting containers is increased to a temperature sufficient to vaporize enclosed source material. The sublimation rate will be greatest on the first or lowest container due to a pure carrier entering that tray versus partially or fully saturated carrier gas entering the containers above it. As such, there may be the need to load more precursor on the bottom container and/or increase the height dimension of the container to allow for a more uniform surface area through the life of the ampoule in the process tool.

A solid used as a source material is vaporized through the process of sublimation, effected by heating the walls of the conductive ampoule that preferably contact a plurality of vertically stacked containers fabricated of conductive material. The process of sublimation entails the transformation of a solid, e.g., decaborane, from a solid state to a vapor state without entering an intermediate liquid state. The present invention is effective for use with any suitable solid source material, e.g., solid materials characterized by sublimation temperatures in a range of between about 20° C. to about 300° C. and having a vapor pressure in a range of from about $10^{-2}$ Torr to about $10^3$ Torr.

Temperature may be controlled within the vaporizer by any heat regulating system including, without limitation, strip heaters, radiant heaters, heated enclosures, circulating fluid heaters, resistant heating systems, inductive heating systems, etc., constructed and arranged for controlled temperature operation. Further, temperature within the ampoule can be sensed by a thermocouple, thermistor, or any other suitable temperature sensing junction or device arranged for contacting a surface of the thermally conductive ampoule and/or containers.

To determine when a container is depleted of source material, the inventors contemplate a level sensor monitoring system to determine the amount of solid or liquid in the top tray and/or in the bottom tray, such as optical sensor communicatively connected to a reflective surface on the bottom surface of a container to provide a change in signal when the container is near empty or empty.

Figure 6:
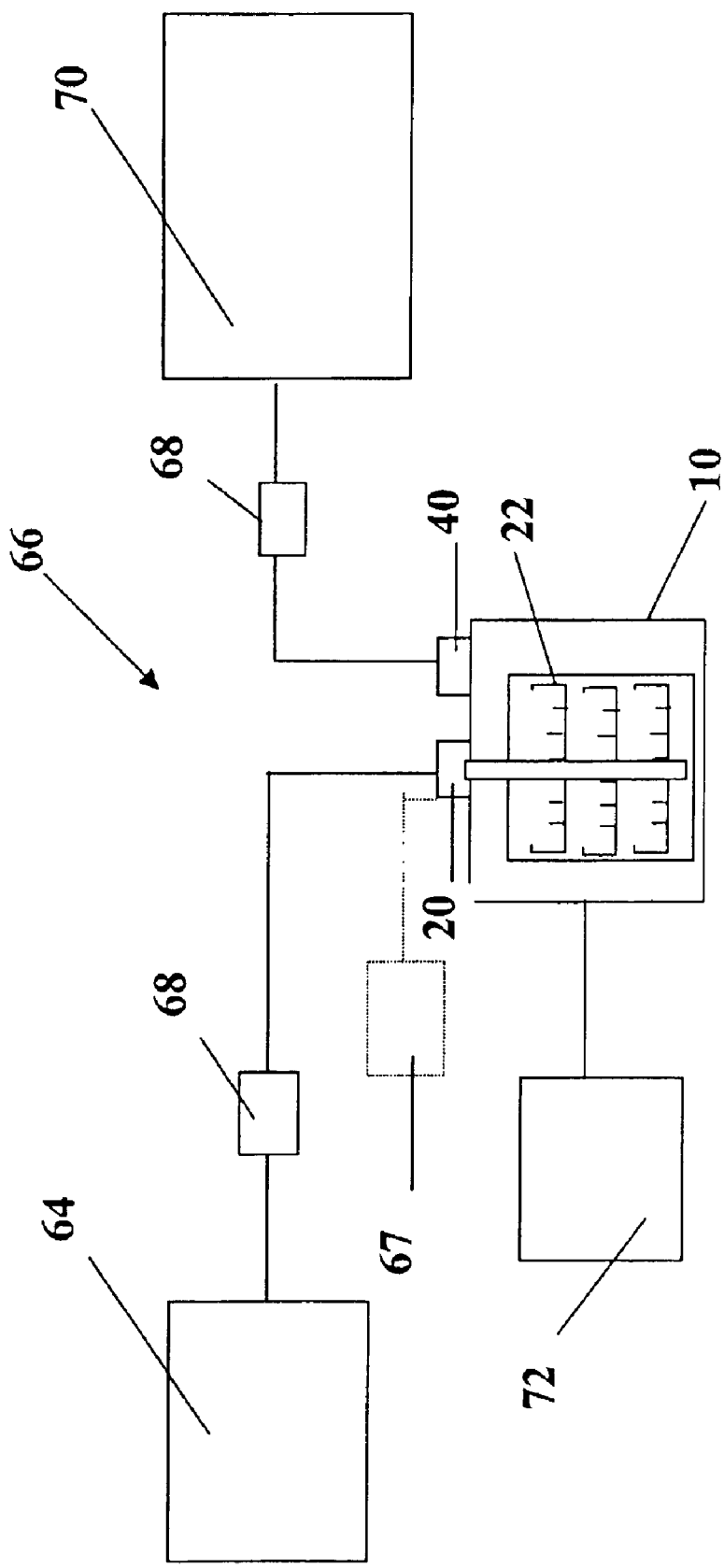
FIG. 6 is a simplified schematic representation of the vaporizer delivery system of the present invention.

FIG. 6 shows a simplified vaporized delivery system 66 for supplying a carrier gas to a vaporizer 10. A carrier gas source 64 is connected to the vaporizer 10 to provide carrier gas. In alternative modes of introducing a source material, a liquid source material may be introduced from liquid source container 67. The flow rates of the carrier gas may be monitored and controlled by flow meters 68 that are disposed in the carrier gas delivery line and lines transporting the vaporized source material to the processing chamber 70. The gas delivery lines are preferably made of a material having a low coefficient of friction such as a polymer, to allow for high flow velocities. Preferably, the vaporizer delivery system is made of a thermally conductive material that provides for transmission of thermal energy generated by at least one heating means 72 communicatively connected to the vaporizer unit 10.

The amount of power required for complete vaporization is a function of the chemistry of the source material and carrier gas, and the flow rate of the mixture. In accordance with the present invention, the thermal power transferred to the vaporizer is between about 100 W to about 3000 W to provide optimum isothermal temperatures. In this manner, the heating power absorbed by the flowing mixture is a small fraction of the heating power which is available. Therefore, the power absorbed by the gas vapor presents an insignificant perturbation in relation to the available heating power, making it possible to substantially maintain an ideal isothermal temperature of the conductive heating surfaces. In operation, the precursor source material is preferably loaded into the container units in a dry box or glove box to eliminate the reaction of the precursor with oxygen and moisture while the ampoule is open. A carrier gas from the gas source 64 is introduced into the vaporizer unit at gas inlet 20 at a gas flow of from 1 sccm to about 500 sccm. The carrier gas is transported into the vaporizer at a pressure to provide a steady flow of carrier gas that is forced through the protuberances of the vertically stacked containers. As the carrier gas transverses upward through the different levels of the vertically stacked containers, the carrier gas becomes saturated with vaporized source material for transport out of the vaporizer unit at gas outlet valve 40 to the process chamber 70.

The advantages of the invention are more fully illustrated with reference to the following examples.

EXAMPLE I

Figure 7:
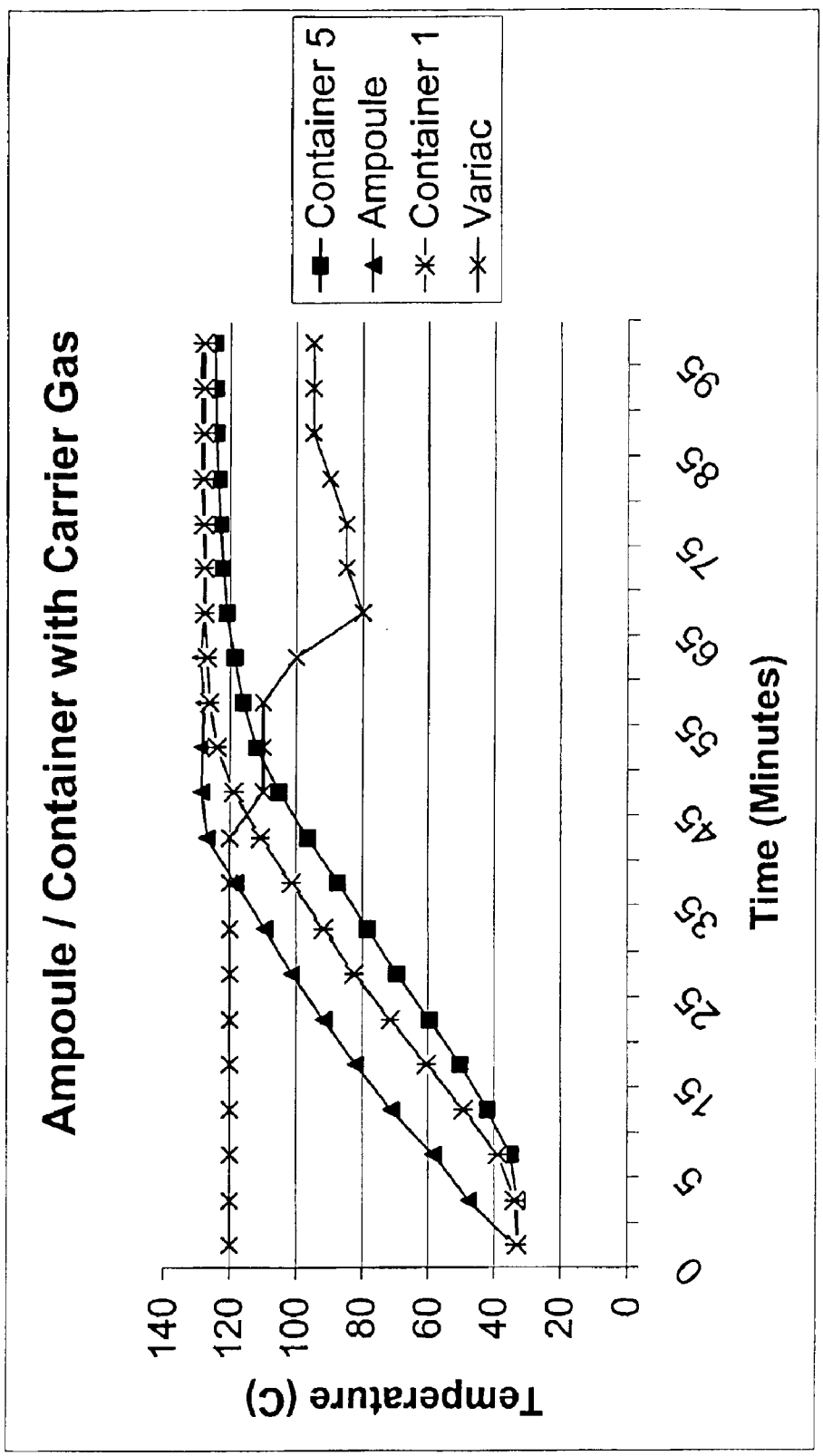
FIG. 7 is a graph showing results of heating the ampoule and sensing temperature within the container unit as a carrier gas is flowed through ampoule of the present invention.

The vaporizer of the present invention comprising a container unit having 5 stacked containers within an ampoule of the present invention such as shown in FIG. 1 was tested to determine the effectiveness of heat conductance from the ampoule to the containers. The ampoule was made of high grade stainless steel and connected to a block heater having a shape fitting around the circumference of the ampoule. The heater was connected to a variable transformer which is a source of variable AC voltage and controls the degree of heating. Several of the individual containers, container 1 and 5, positioned within the ampoule were connected to temperature sensors to determine the evenness of heating and effectiveness of heat transference from the ampoule to the containers. The ampoule was connected to a source of carrier gas for introduction into the ampoule and through the container unit at about 500 sccm. As shown in FIG. 7, as the temperature is increased in the heater attached to the ampoule, the internal temperature sensed in the containers was also increased responding to the effectiveness of heat conductance. The temperatures sensed in containers 1 and 5 were comparable to that of the ampoule indicating evenness of heating throughout the stack of containers. Thus, the individual containers provide for additional surface area that is evenly heated to vaporize precursor materials.

Figure 8:
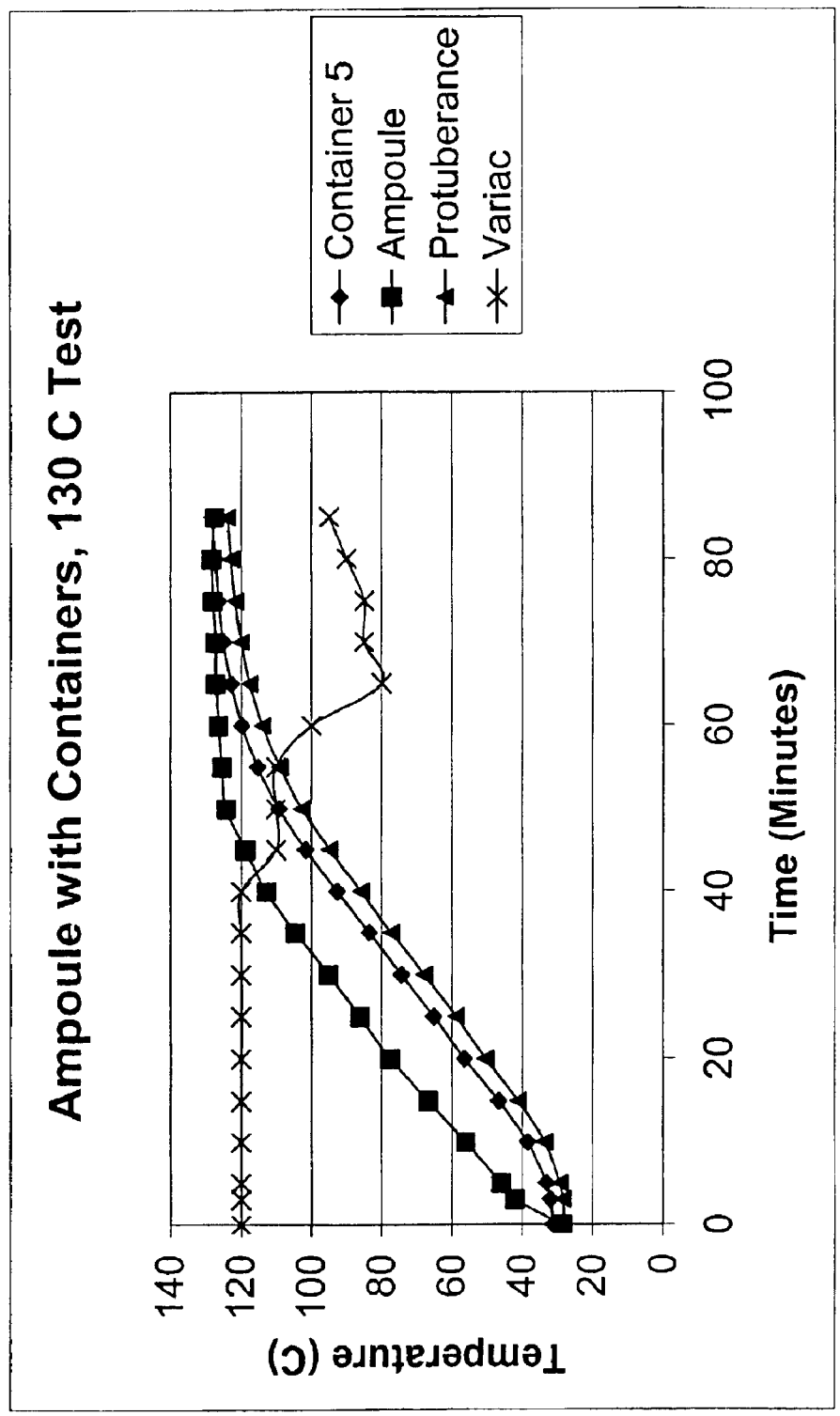
FIG. 8 is a graph showing results of heating the ampoule and sensing temperature within the container unit and protuberance within the ampoule of the present invention.

FIG. 8 illustrates the distribution of heat from the ampoule to a protuberance positioned in container 5. The temperature is raised to 130° C. and heat distribution within the ampoule was nearly constant after the first hour of vaporization. Because the multiple containers provide an increased area for placement of the precursor material more product may be produced without refilling of the ampoule thereby reducing off-time of the instrument.

What is claimed is:

1. A vapor delivery system for vaporization and delivery of a source material, comprising:

a) an ampoule comprising an ampoule bottom, sidewall and removable top to form an internal ampoule compartment;

b) a gas inlet and gas outlet communicatively connected to the ampoule;

c) at least one source material container positioned within the internal ampoule compartment, wherein the container comprises a container bottom and side wall to form a container cavity; and d) a plurality of channeled protuberances positioned in the container bottom to provide channels therethrough, wherein the channeled protuberances extend into the container cavity; and e) an internal gas carrying member positioned within the internal compartment, extending through the container bottom and communicatively connected to the gas inlet.

2. The vapor delivery system according to claim 1, wherein the internal gas carrying member extends through the center of the container bottom.

3. The vapor delivery system according to claim 1, wherein the container sidewall is of sufficient height to retain a solid precursor therein.

4. The vapor delivery system according to claim 1, wherein the plurality of channeled protuberances are positioned on the container bottom.

5. The vapor delivery system according to claim 1, wherein the container bottom, sidewall and plurality of channeled protuberances have a surface area approximately equal to the surface area of the internal compartment of the ampoule.

6. The vapor delivery system according to claim 4, comprising a plurality of vertically stacked containers positioned in the internal compartment.

7. The vapor delivery system according to claim 6, wherein each container side wall is of sufficient height to contact an overlying vertically adjacent container to form a gas holding space therebetween.

8. The vapor delivery system according to claim 7, wherein the height of the channeled protuberances is lower than the height of the container side wall.

9. The vapor delivery system according to claim 8 wherein the internal gas carrying member extends through the plurality of vertically stacked containers.

10. The vapor delivery system according to claim 9, wherein the container sidewall of each of the plurality of vertically stacked containers contacts the ampoule sidewall.

11. The vapor delivery system according to claim 10 further comprising a sealing o-ring positioned between the internal gas carrying member and the point of extending through each of the plurality of vertically stacked containers.

12. The vapor delivery system according to claim 11, wherein the gas inlet and gas outlet are positioned on the ampoule top.

13. The vapor delivery system according to claim 12, wherein the gas inlet is positioned approximately in the center of the ampoule top.

14. The vapor delivery system according to claim 13, wherein the internal gas carrying member is a carrier gas dip tube.

15. The vapor delivery system according to claim 14, wherein the carrier gas dip tube extends through the plurality of vertically stacked containers to the bottom of the internal compartment.

16. The vapor delivery system according to claim 14, wherein the channeled protuberances are funnel shaped having a first end with a smaller diameter than a second end.

17. The vapor delivery system according to claim 16, wherein the first end with the smaller diameter extends into the container cavity thereby directing carrier gas to the gas outlet and reducing backflow of carrier gas.

18. The vapor delivery system according to claim 14, wherein the ampoule and plurality of vertically stacked containers are fabricated of a heat conducting material.

19. The vapor delivery system according to claim 1, further comprising means for heating the ampoule.

20. A vaporizer comprising:
   a) an ampoule comprising an ampoule bottom and an ampoule sidewall to form an internal compartment;
   b) an ampoule top to enclose the internal compartment;
   c) a gas inlet and gas outlet communicatively connected to the ampoule top;
   d) a plurality of vertically stacked contacting containers positioned within the internal compartment, wherein each container comprises a container bottom and a container sidewall to form a container cavity for holding of a solid precursor material, and wherein each container sidewall contacts the ampoule sidewall;
   e) a plurality of channeled protuberances positioned on each container bottom to provide channels between adjacent vertically stacked contacting containers, wherein the channeled protuberances extend into the container cavity;
   f) a carrier gas dip tube positioned within the internal compartment and communicatively connected to the gas inlet for directing a carrier gas to below the vertically stacked contacting containers; and
   g) means for heating the ampoule.

21. A vaporizer unit, comprising:
   a) a plurality of vertically stacked containers wherein each container has a cavity for holding a vaporizable source material;
   b) a plurality of channeled protuberances positioned in each of the vertically stacked containers and extending into each respective cavity, wherein the channeled vented protuberances form channels for passage of a carrier gas and vaporized source material between adjacent vertically stacked containers; and
   c) a carrier gas tube positioned to pass through the bottom of the container contacting the plurality of vertically stacked containers and extending through the cavity of each vertically stacked container.

22. The vaporizer unit of claims 21, wherein each of the vertically stacked containers is contacting at least one adjacent container.

23. The vaporizer unit of claim 21, wherein the channeled protuberances are funnel-shaped and narrowing as extending into container cavity.

24. The vaporizer unit of claim 21, wherein the vaporizable source material is a solid precursor.

25. The vaporizer unit of claim 24, wherein the channeled protuberances have sidewalls comprising vents therein for transmission of carrier gas through the solid precursor for fluidizing of same.

26. A vaporizing unit comprising:
   a) multiple vertically stacked containers therein, wherein each container has a bottom and sides for holding a vaporizable source material;
   b) a plurality of channeled protuberances positioned on the bottom of the container, wherein the channeled protuberances provide channels for passage of at least vaporized source material; and
   c) a carrier gas tube positioned to pass through the bottom of the container to introduce a stream of the carrier gas for passage through the channeled protuberances.

27. A method for delivering a vaporized source material to a downstream process chamber, the method comprising:
   a) providing a plurality of interconnected, vertically stacked containers having a vaporizable source material contained therein, wherein each of interconnected, vertically stacked containers comprise a plurality of channeled protuberances;
   b) positioning the interconnected, vertically stacked containers within a sealable ampoule;
   c) applying heat to the sealable ampoule in a sufficient amount to vaporize the source material therein; and
   d) introducing a carrier gas into the sealable ampoule for moving the vaporized source material through the sealable ampoule to the process chamber, wherein the direction of the carrier gas is directed to the bottom of the stacked containers and concurrent to the direction of the vaporized source material moving through the plurality of channeled protuberances.

28. The method of claim 27, wherein the vertically stacked containers comprise a plurality of channeled protuberances to form a channel between adjacent vertically stacked containers.

29. The method of claim 27, wherein each of the vertically stacked containers is contacting at least one adjacent container.

30. The method of claim 27, wherein the vaporizable source material is a solid precursor.

31. A vaporizer comprising:
   a) an ampoule comprising an ampoule bottom and an ampoule sidewall to form an internal compartment;
   b) an ampoule top to enclose the internal compartment;
   c) a gas inlet and gas outlet communicatively connected to the ampoule top;
   d) a plurality of vertically stacked contacting containers positioned within the internal compartment, wherein each container comprises a container bottom and a container sidewall to form a container cavity for holding of a solid precursor material, and wherein each container sidewall contacts the ampoule sidewall;
   e) a plurality of vents positioned on each container bottom to provide channels between adjacent vertically stacked contacting containers;
   f) a carrier gas dip tube positioned within the internal compartment and communicatively connected to the gas inlet for directing a carrier gas to below the vertically stacked contacting containers; and
   g) means for heating the ampoule.

32. The vapor delivery system according to claim 14, wherein the channeled protuberances are cylindrically shaped having a first end with about the same diameter as a second end.

33. The vaporizer unit of claim 21, wherein the channeled protuberances are cylindrically-shaped.

* * * * *